US006664843B2

(12) United States Patent
Dasgupta et al.

(10) Patent No.: US 6,664,843 B2
(45) Date of Patent: Dec. 16, 2003

(54) GENERAL-PURPOSE TEMPERATURE COMPENSATING CURRENT MASTER-BIAS CIRCUIT

(75) Inventors: Uday Dasgupta, Singapore (SG); Wooi Gan Yeoh, Singapore (SG)

(73) Assignees: Institute of Microelectronics, Singapore (SG); Oki Techno Centre (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 09/999,001

(22) Filed: Oct. 24, 2001

(65) Prior Publication Data

US 2003/0080807 A1 May 1, 2003

(51) Int. Cl.$^{7}$ .......................... H01L 35/00; H01L 37/00; H03K 3/42; H03K 17/78

(52) U.S. Cl. ....................... 327/512; 327/539; 327/538; 323/312; 323/315

(58) Field of Search ................................. 327/512, 513, 327/539, 538; 323/312, 313, 315, 907

(56) References Cited

U.S. PATENT DOCUMENTS

| | | | | |
|---|---|---|---|---|
| 4,656,375 A | | 4/1987 | Lauffer et al. | 307/475 |
| 5,021,684 A | | 6/1991 | Ahuja et al. | 307/443 |
| 5,471,173 A | | 11/1995 | Moore et al. | 330/256 |
| 5,777,524 A | | 7/1998 | Wojewoda et al. | 331/116 R |
| 5,796,244 A | | 8/1998 | Chen et al. | 323/313 |
| 5,883,507 A | | 3/1999 | Yin | 323/316 |
| 5,952,873 A | | 9/1999 | Rincon-Mora | 327/539 |
| 6,154,087 A | * | 11/2000 | Ito | 327/512 |
| 6,157,245 A | | 12/2000 | Rincon-Mora | 327/539 |
| 6,191,646 B1 | | 2/2001 | Shin | 327/543 |
| 6,222,470 B1 | * | 4/2001 | Schuelke | 341/119 |
| 6,346,848 B1 | * | 2/2002 | Shkap | 327/538 |
| 6,452,437 B1 | * | 9/2002 | Takeuchi et al. | 327/513 |

* cited by examiner

*Primary Examiner*—Terry D. Cunningham
*Assistant Examiner*—Quan Tra
(74) *Attorney, Agent, or Firm*—George O. Saile; Stephen B. Ackerman; Billy Knowles

(57) ABSTRACT

A temperature compensating biasing circuit is constructed by first determining a piecewise function substantially describing a required bias current with respect to temperature. Reference signals are created such that each reference signal describes an amount of contributing currents that, when summed together, generate a master biasing current. The biasing current generator is further constructed to create a thermal signal indicating an operating temperature. Each of the reference signals is compared to the thermal signal. The biasing current generator then identifies which of the contributing currents or portions of the contributing currents are being included to generate the master biasing current. The identified contributing currents and the portions of the contributing currents are then summed to form the master biasing current. The master biasing current may be mirrored to form bias currents that have the temperature compensation bias function.

30 Claims, 5 Drawing Sheets

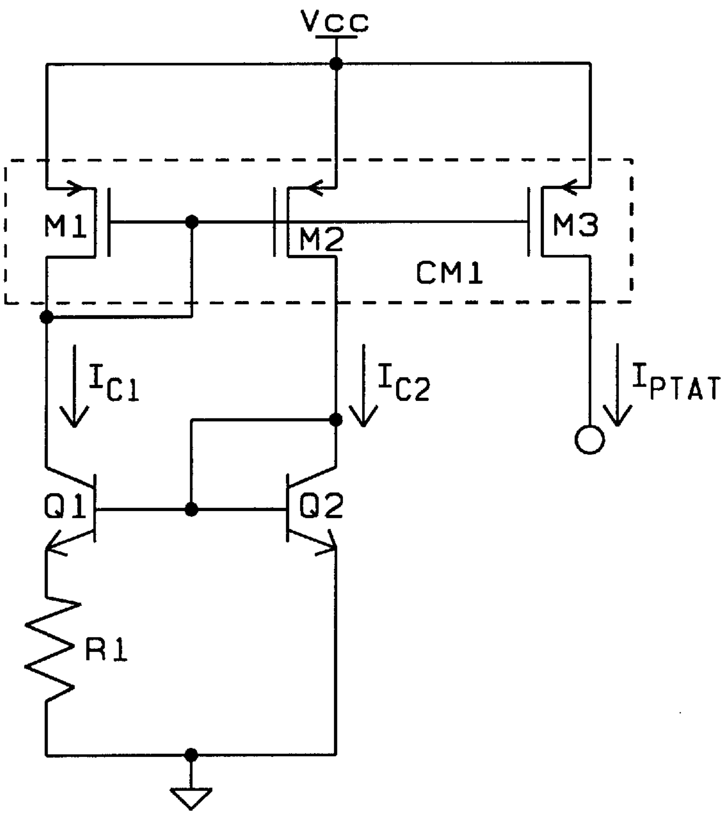
FIG. 1 - Prior Art
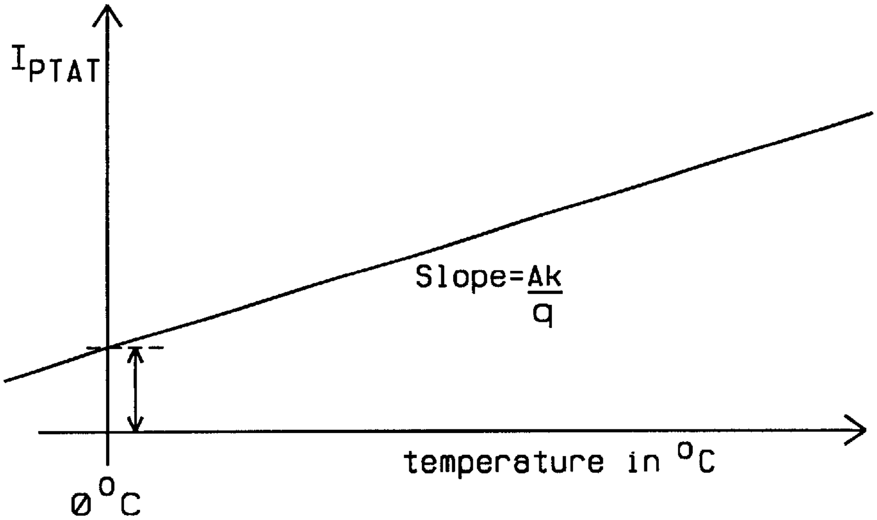
FIG. 2 - Prior Art

GENERAL-PURPOSE TEMPERATURE COMPENSATING CURRENT MASTER-BIAS CIRCUIT

BACKGROUND OF THE INVENTION

1. Field of the Invention

This invention relates to electronic circuits and systems. More particularly, this invention relates to circuits that generate biasing currents for circuits. This invention, especially, relates to circuits that generate biasing currents that provide variations in these biasing currents to compensate for functional circuit variations due to changes in operating temperature of the functional circuits.

2. Description of Related Art

Presently designed analog circuits generally employ current biasing rather than voltage biasing. Current biasing, firstly, allows the operating points of the transistors to be relatively independent of the fabrication process parameters. Secondly, current biasing is less prone to noise pickup. Thirdly, the temperature coefficient of the biasing current can be easily altered to provide temperature compensation to some of the small signal parameters, particularly, transconductance ($g_m$) of transistors. For the purpose of current biasing, a current master-bias circuit is usually employed. However, the slope of the temperature characteristic of the bias current from the master-bias circuit might have to be different for different circuits and even for the same circuit using different fabrication processes, if reasonably precise temperature compensation is required. Therefore, a master-bias current circuit must be able be easily adaptable to provide different characteristics for the bias current.

A Proportional To Absolute Temperature (PTAT) current generator as shown in FIG. 1 is very widely used as a temperature compensated current master-bias circuit. The NPN bipolar transistors Q1 and Q2, resistor R1, and an active current mirror circuit CM1 form the PTAT current generator. The current mirror circuit CM1 forces the collector currents of transistors Q1 and Q2 to be equal which is shown as $I_{C1}$ and $I_{C2}$. If the small base current of Q1 is ignored, it can be shown that the collector currents $I_{C1}$ and $I_{C2}$ of transistors Q1 and Q2 is determined by the equation:

$$I_{C1} = I_{C2} = \frac{V_{be_{Q2}} - V_{be_{Q1}}}{R_1} \qquad \text{Eq. 1}$$

where:

- $V_{beQ1}$ and $V_{beQ2}$ are the voltages developed between the base and emitter respectively of the transistors Q1 and Q2.
- $R_1$ is the resistance of the resistor R1.

It is known that the base emitter voltages $V_{beQ2}$ & $V_{beQ1}$ of the transistors Q1 and Q2 are determined by the equation:

$$V_{be} = V_T \ln\left(\frac{I_C}{J_S A}\right) \qquad \text{Eq. 2}$$

where:

$V_T$ is a thermal voltage given by the equation:

$$V_T = \frac{kT}{q} \qquad \text{Eq. 3}$$

where:

- k is Boltzmann's constant,
- T is the operating temperature of the transistor generally in degrees Kelvin, and
- q is the electrical charge of an electron.

$I_C$ is the collector current of an NPN transistor.

$J_S$ is the saturation current density per unit area.

A is the emitter area.

By substituting Eq. 2 and Eq. 3 into Eq. 1, it can be shown that the collector currents $I_{C1}$ and $I_{C2}$ of transistors Q1 and Q2 are equal to:

$$\begin{aligned} I_{C1} = I_{C2} &= \frac{V_T}{R_1}\ln\left(\frac{I_{C2}}{J_S A_2}\right) - \ln\left(\frac{I_{C1}}{J_S A_1}\right) \\ &= \frac{V_T}{R_1}\ln\left(\frac{A_2}{A_1}\right) = A V_T \end{aligned} \qquad \text{Eq. 4}$$

If the current mirror CM1 is designed such that the MOS transistors M1, M2, and M3 are of equal sizes, then the PTAT current $I_{PTAT}$ is equal to collector currents $I_{C1}$ and $I_{C2}$ and is given by the equation:

$$I_{PTAT} = A V_T \qquad \text{Eq. 5}$$

where:

$$A = \frac{1}{R_1}\ln\left(\frac{A_2}{A_1}\right)$$

and is the constant simplified from the terms of Eq. 4.

$V_T$ is the thermal voltage of Eq. 3.

FIG. 2 shows the temperature behavior of the PTAT current $I_{PTAT}$ versus temperature. The constant $$A\frac{k}{q}$$

is the slope of the line. This kind of linear characteristic is usually very effective for providing temperature compensation for Bipolar transistors.

The transconductance $g_{mbip}$ for a bipolar transistor is given by:

$$g_{mbip} = \frac{I_C}{V_T} \qquad \text{Eq. 6}$$

where, $I_C$ is the collector current.

If a bipolar transistor is biased by a PTAT current $I_{PTAT}$, the PTAT current $I_{PTAT}$ found in Eq. 5 is substituted for the collector current $I_C$ in Eq. 6, the transconductance $g_{mbip}$ of the bipolar transistor becomes:

$$g_{mbip} = A. \qquad \text{Eq. 7}$$

Thus the PTAT current generator effectively forces the transconductance of the bipolar transistor to be constant over temperature.

Conversely, for MOS transistors in strong-inversion, the PTAT current generator does not provide an effective temperature compensation. The transconductance $g_{mMos}$ of a MOS transistor is given by the equation:

$$g_{mMOS} = \sqrt{2I_D\mu C_{OX}\frac{W}{L}} \quad \text{Eq. 8}$$

where:

$I_D$ is the drain current of the MOS transistor.

$C_{OX}$ is the gate oxide capacitance per unit area of the MOS transistor.

W/L the aspect ratio of the MOS transistor $\mu$ the carrier mobility given by the equation:

$$\mu = BT^{-m}$$

where:

B is a constant.

m is a process dependent exponent that has a typical value of 1.5.

T is temperature in degrees Kelvin.

If a MOS transistor is biased by a PTAT current $I_{PTAT}$, the PTAT current $I_{PTAT}$ found in Eq. 5 is substituted for the drain current $I_D$ in Eq. 8, the transconductance $g_{mMos}$ of the MOS transistor is found by the equation:

$$g_{mMOS} = \sqrt{\frac{2kABWC_{OX}}{qL}}\,T^{\frac{1-m}{2}} \quad \text{Eq. 9}$$

It is known in the art the process dependent exponent m is not easily controllable and is almost never has a magnitude of 1. Thus it becomes obvious from Eq. 9 that the transconductance $g_{mMos}$ has a level of temperature dependence even if biased with a PTAT current $I_{PTAT}$ U.S. Pat. No. 6,157,245 (Rincon-Mora) describes a curvature corrected bandgap reference voltage circuit, the output voltage that is substantially linear and independent of the operating temperature of the circuit. The circuit includes a voltage divider network comprised of a first resistor and a second resistor connected in series. A first compensating circuit provides a first, linear, operating temperature-dependent current, and a second compensating circuit provides a second, logarithmic, operating temperature-dependent current. The first current is supplied to the first resistor of the voltage divider network, while the second current is supplied to the second resistor of the voltage divider network.

U.S. Pat. No. 5,952,873 (Rincon-Mora) illustrates a low voltage, current-mode, piecewise-linear curvature corrected bandgap reference circuit. The bandgap circuit includes a first current source supplying a current proportional to a base-emitter voltage, a second current source supplying a current proportional to absolute temperature, and a third current source supplying a non-linear current. Three resistors are coupled in series between a first node and ground. The first current source is coupled to the first node. The second current source is coupled to a second node between the first and second resistors. The third current source is coupled to a third node between the second and third resistors. An output coupled to the first node supplies a reference voltage.

U.S. Pat. No. 5,883,507 (Yin) describes a low power temperature compensated, current source. The current source creates a first reference current and a temperature compensating voltage-controlling circuit generates a temperature compensated voltage control signal during temperature variations. A bias controlling circuit is connected to the current generating circuit and the temperature compensating voltage control circuit to bias the temperature compensating voltage control circuit. A current output controlling circuit is connected to the current generating circuit and the temperature compensating voltage controlling circuit for controlling a second temperature compensated reference current to generate a high output source current even during low temperature conditions.

U.S. Pat. No. 5,796,244 (Chen et al.) teaches a voltage reference circuit that will remain constant and independent of changes in the operating temperature that is correlated to the bandgap voltage of silicon is described. The voltage reference circuit will be incorporated within an integrated circuit and will minimize currents into the substrate. The bandgap voltage reference circuit has a bandgap voltage referenced generator that will generate a first referencing voltage having a first temperature coefficient, and a compensating voltage generator that will generate a second referencing voltage having a second temperature coefficient. The second temperature coefficient is approximately equal to and has an opposite sign to the first temperature coefficient. A voltage summing circuit will sum the first referencing voltage and the second referencing voltage to create the temperature independent voltage. A voltage biasing circuit will couple a bias voltage to the bandgap voltage referenced generating means to bias the bandgap voltage referenced generator to generate the first referencing voltage.

U.S. Pat. No. 6,191,646 (Shin) teaches a temperature-compensated high precision current source, which provides a constant current regardless of temperature change. The temperature-compensated high precision current source has a control circuit connected to a voltage supply for producing control signal. A first current generating circuit generates a first current, which is proportional to absolute temperature in response to the signals from the control circuit. A first current transferring circuit transfers the first current to a common node. A second current generating circuit generates a second current, which is inversely proportional to absolute temperature in response to the signals from the control circuit. A second current transferring circuit transfers the second current to the common node. The common node adds the first and second currents to generate a third current that is compensated for a current variation caused by the temperature variation at the first and second current generating circuits. An output circuit is connected to the common node for receiving the third current from the common node and generating a constant output current.

SUMMARY OF THE INVENTION

An object of this invention is to provide a circuit that generates a master biasing current that has a unique variation with changes in temperature.

Another object of this invention is to provide a circuit that generates a master biasing current and biasing currents mirrored from the master biasing current such that the master biasing current and the mirrored biasing currents have unique variation with changes in temperature.

To accomplish at least one of these as well as other objects, a temperature compensating biasing circuit is constructed by first determining a piecewise function substantially describing a required bias current with respect to temperature. Reference signals are created such that each reference signal describes an amount of a contributing current of a plurality of contributing currents. The selected contributing currents, when summed together, generate the master biasing current. The biasing current generator is further constructed to create a thermal signal, such that the magnitude of the thermal signal indicates a temperature of the functional circuit to which the biasing currents are supplied. Each of the reference signals is compared to the thermal signal. The biasing current generator then identifies which of the contributing currents or portions of the contributing currents are being included to generate the master biasing current. The identified contributing currents and the portions of the contributing currents are then summed to form the master biasing current.

To accomplish the function as above described, the temperature compensating bias current generator has a temperature-to-current converter to provide a thermal signal indicating a temperature value of current and a current function generator in communication with the temperature-to-current converter to multiply the thermal signal by a bias function having the unique temperature characteristics to create the master biasing current. The temperature-to-current converter has a temperature independent current source, a proportional-to-absolute-temperature current source, and a current difference circuit. The temperature independent current source provides a first current that does not fluctuate with a change in temperature. The proportional-to-absolute-temperature current source provides a second current that varies by a known function (generally linear) with temperature. The current difference circuit is connected to the temperature independent current source and the proportional-to-absolute-temperature current source to receive the first and second currents and from the first and second currents generates the thermal signal. The thermal signal is indicative of a difference between the first and second currents, which a current measure of the temperature.

The current function generator is in communication with the temperature-to-current converter to receive the thermal signal. The thermal signal is compared with the reference signals to determine which of the contributing currents or portions of the contributing currents indicated by the reference signals are to be added to form the master biasing current. The reference signals are generated by a bandgap voltage generator and are chosen to determine the bias function.

The master biasing current may be used as the reference current for a plurality of mirrored current sources that provide a plurality of bias currents that have the temperature compensation bias function as determined by the master biasing current.

The current difference circuit includes a current subtractor circuit. The current subtractor circuit is in communication with the temperature independent current source and the proportional-to-absolute-temperature current source to receive the first and second currents and to subtract the first and second to generate a thermal current. A signal converter is connected to the current subtractor to receive the thermal current and convert the thermal current to the thermal signal.

The current function generator comprises a current multiplier in communication with the temperature-to-current converter to receive the thermal signal, compare the thermal signal with the reference signals to determine a contributing currents indicated by the reference signals to be added to form the master biasing current. The current multiplier is formed of a plurality of current steering circuits, each current steering circuit comparing the thermal current difference signal to one of the plurality of reference signals to selectively steer all or some of one of the contributing currents to an output node. The current steering circuits are all connected to a current summing node to additively combine the selectively steered contributing currents to form the master biasing current.

Each current steering circuit has a first and second MOS transistor. The first MOS transistor has a gate to receive the thermal signal, and a drain connected to a voltage reference terminal, and the a second MOS transistor has a gate to receive one of the reference signals, and a drain connected to the current summing node to provide some or all of the contributing current. A first current source is in communication with a source of the first MOS transistor to provide some or all a first portion of the contributing current, and a second current source is in communication with a source of the second MOS transistor to provide some or all a second portion of the contributing current. A resistor is connected between the sources of the first and second MOS transistors such that some or all of the first and second portions or the contributing current selectively flow through the first or second MOS transistor.

The current steering circuit adjusts the contributing current such that, if the thermal signal has a magnitude between a sum and a difference of the reference signal at the gate of the second MOS transistor and a signal developed at the resistor, an amount of the contributing current transferred to the output node is determined by the equation:

$$I_y = I_1 + \frac{V_c - V_{R1}}{R}$$

where:

$I_y$ is the amount of the contributing current, $I_1$ is a magnitude of the first portion of the contributing current, $V_C$ is the thermal signal, $V_{R1}$ is the reference signal, and R is the resistance of the resistor.

However, each current steering circuit adjusts the current steering current such that, if the thermal signal has a magnitude that is less than the difference of the reference signal at the gate of the second MOS transistor and the signal developed at the resistor, the amount of the contributing current transferred to the output node is zero. Finally each current steering circuit adjusts the contributing current such that, if the thermal signal has a magnitude greater than the sum of the reference signal at the gate of the second MOS transistor and the signal developed at the resistor, the amount of the contributing current transferred to the output node is a sum of the first and second portions of the contributing current.

BRIEF DESCRIPTION OF THE DRAWINGS

FIG. 1 is a schematic diagram of a proportional-to-absolute-temperature current generator of the prior art.

FIG. 2 is a plot of the output current of the proportional-to-absolute-temperature current generator of FIG. 1 versus temperature.

DETAILED DESCRIPTION OF THE INVENTION

A temperature compensating biasing circuit of this invention provides the biasing currents to functional circuits to compensate for variation in the operating parameters of the functional circuits. It is known in the art that adjusting the biasing currents can compensate temperature effects on functional circuits. The temperature compensating biasing circuit functions by first generating a thermal signal indicative of the operating temperature of the circuitry. The thermal signal is compared to multiple reference signals. Some or all of a group of contributing currents are summed to form the master biasing current. The master biasing current is constructed by first determining a piecewise function substantially describing a required bias current with respect to temperature. The reference signals are created such that each reference signal describes an amount of a contributing current of a plurality of contributing currents. The selected contributing currents, when summed together, generate the master biasing current. The biasing current generator then identifies which of the contributing currents or portions of said contributing currents are to be included to generate the master biasing current. The identified contributing currents and the portions of the contributing currents are then summed to form the master biasing current.

Figure 3:
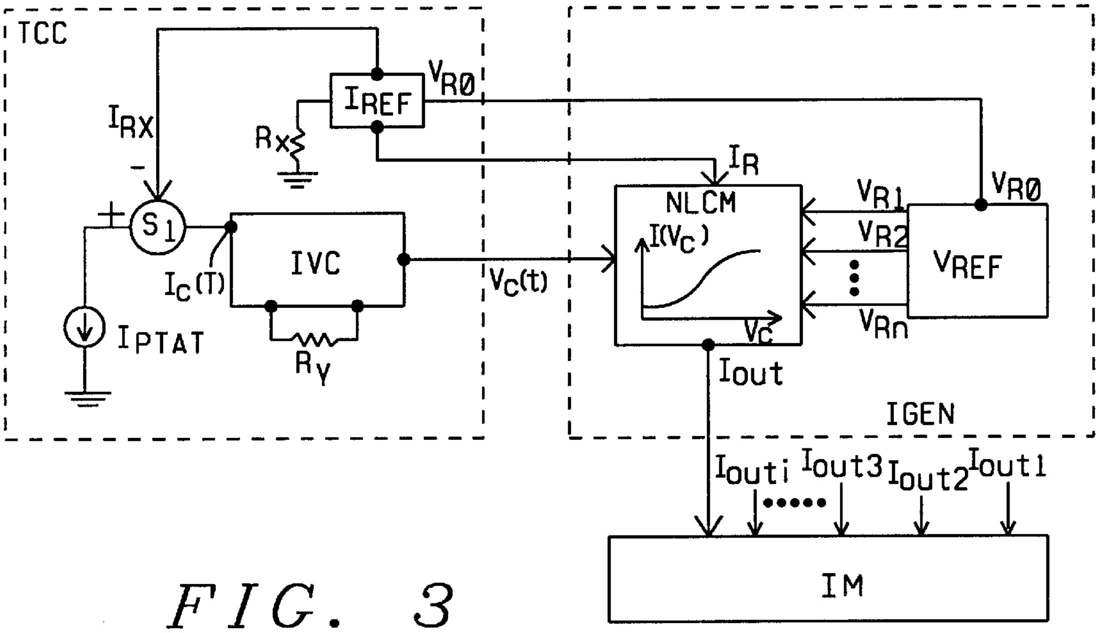
FIG. 3 is a functional block diagram of a master biasing current generator of this invention.
Figure 4:
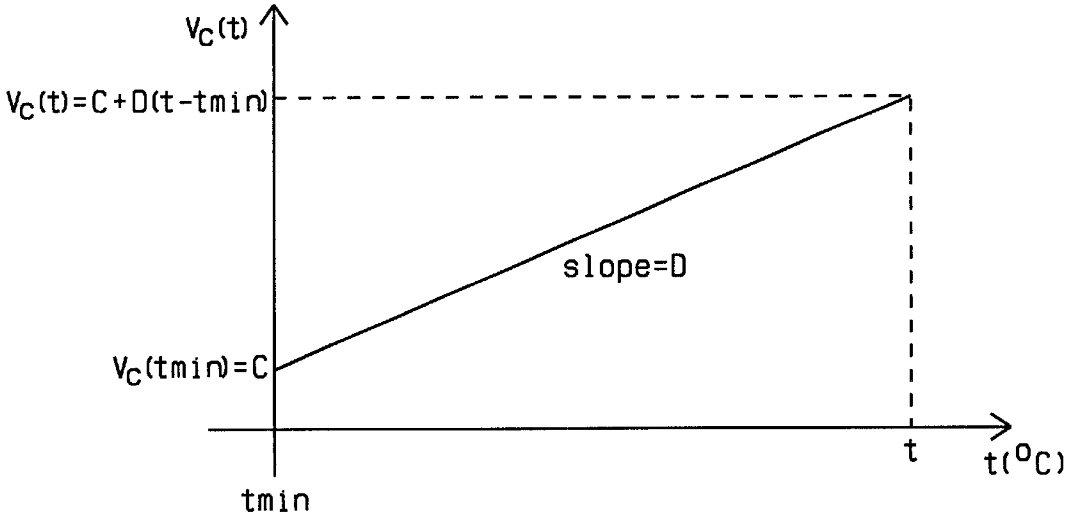
FIG. 4 is a plot of a segment of the thermal signal of the master biasing current generator of this invention versus temperature.

Refer now to FIG. 3 for a detailed description of temperature biasing circuit of this invention. The temperature-to-current converter TCC has a reference current generator $I_{REF}$ that produces a temperature independent current $I_{RX}$ and a current source $I_{PTAT}$ that produces proportional-to-temperature current. The temperature independent current $I_{RX}$ and the proportional-to-temperature current $I_{PTAT}$ are inputs to the subtractor $S_1$. The subtractor $S_1$ subtractively combines the temperature independent current $I_{RX}$ and the proportional-to-temperature current $I_{PTAT}$ to form the output of the subtractor $S_1$ that is a thermal control current $I_C(t)$. The output of the subtractor $S_1$ is the input to the current-to-voltage converter IVC. The current-to-voltage converter IVC generates a thermal signal $V_C(t)$ at its output. The thermal signal $V_C(t)$ in this embodiment is a voltage that is an input to a current function generator IGEN. Refer to FIG. 4 for a discussion of the function of the thermal signal $V_C(t)$ versus temperature. In this instance, the thermal signal $V_C(t)$ has a linear function of the equation:

$$V_C(t)=C+D(t-t_{min})$$

where:

C is the value of the of the thermal signal $V_C(t)$ at the minimum temperature $t_{min}$.

D is the slope of the function.

t is the present temperature of the circuit.

The current function generator IGEN has a bandgap referenced voltage generator $V_{REF}$ that generates the multiple reference signals $V_{R1}$, $V_{R1}$, $V_{R2}$, . . . , $V_{Rn}$ that are used to describe temperature characteristics of the desired function of the master biasing generator output current $I_{OUT}$. The multiple reference signals $V_{R1}$, $V_{R1}$, $V_{R2}$, . . . , $V_{Rn}$ are the inputs with the thermal signal $V_C(t)$ to the nonlinear-current-multiplier circuit NLCM. The contributing reference current IR is transferred from the reference current source $I_{REF}$ to the nonlinear-current-multiplier circuit NLCM. The contributing reference current $I_R$ is mirrored to form the individual reference currents that are summed to create the master biasing generator output current $I_{OUT}$.

The thermal signal $V_C(t)$ is compared to each of the individual multiple reference signals $V_{R1}$, $V_{R1}$, $V_{R2}$, . . . , $V_{Rn}$. Based on this comparison some or all of portions of the individual reference currents are generated and then summed to create the master biasing generator output current $I_{OUT}$.

The output of the master current generator IGEN is connected to the current mirror circuit IM. The current mirror circuit IM mirrors the master biasing generator output current $I_{OUT}$ to generate the biasing currents $I_{OUT1}$, $I_{OUT2}$, $I_{OUT3}$, and $I_{OUTi}$. The biasing currents $I_{OUT1}$, $I_{OUT2}$, $I_{OUT3}$, and $I_{OUT1}$ provide biasing currents to functional circuits to compensate for changes in operation of the functional circuits due to changes in temperature.

Figure 5:
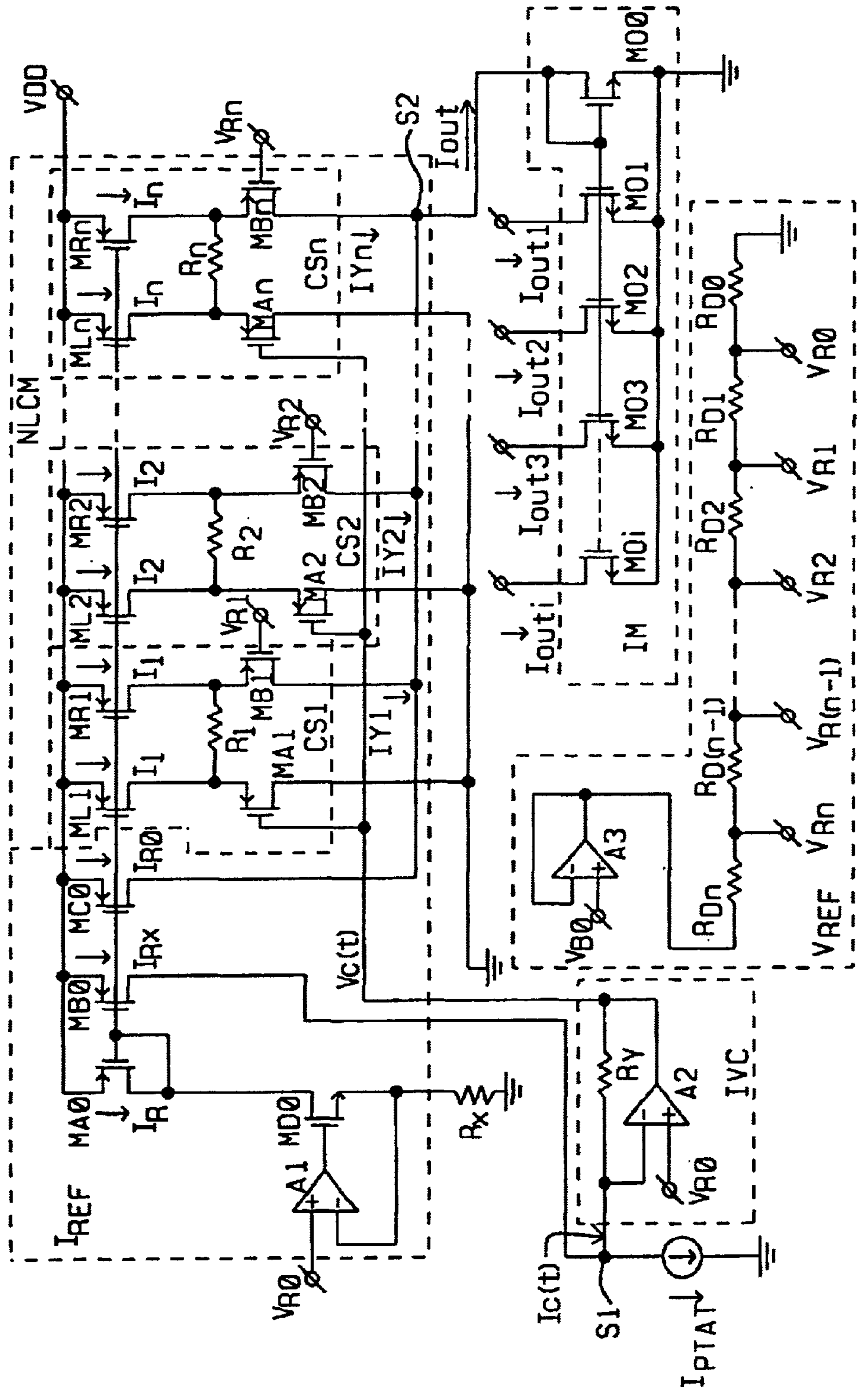
FIG. 5 is schematic diagram of the master biasing current generator of this invention.

A preferred embodiment of the temperature compensated biasing current generation circuit is shown in FIG. 5. Refer now simultaneously FIGS. 3 and 5. The MOS transistors MA0, MB0 and the amplifier $A_1$ form the temperature independent current source $I_{REF}$. The transistors MA0 is configured as a current source. The transistors MB0, MC0, ML1, MR1, ML2, MR2, . . . , MLn, MRn are current mirrors. The current source reference current $I_R$ is a temperature independent current that is determined by the MOS transistor MD0, the amplifier $A_1$ and the resistor $R_X$, and the reference voltage VR0. The reference voltage $V_{R0}$ is referenced to the bandgap of the semiconductor. The amplifier $A_1$ ensures that the reference voltage $V_{R0}$ is maintained across the resistor $R_X$. The current $I_R$ through the resistor $R_X$ and MOS transistors MA0 and MD0 is forced to be:

$$I_R = \frac{V_{RO}}{R_X}$$

Neglecting the temperature variations of the resistor $R_X$, the current $I_R$ is independent of temperature variations. The currents $I_{Rx}$, $I_0$, $I_1$, . . . , $I_n$ are mirrored from the current $I_R$ and are therefore, proportional to the current $I_R$.

The temperature independent reference current $I_{RX}$ is transferred from the drain of the MOS transistor MB0 and is mirrored from the reference current $I_R$. The temperature independent reference current $I_{RX}$ is transferred to the subtracting node S1. The proportional-to-absolute-temperature current source $I_{PTAT}$ is connected to the subtracting node S1 and is arranged such that the thermal current $I_C(t)$ is the difference between the temperature independent reference current $I_{RX}$ and the proportional-to-absolute-temperature current source $I_{PTAT}$.

The amplifier $A_2$ and the resistor $R_y$ form the current-to-voltage converter IVC. The resistor $R_y$ is connected between the inverting input and the output of the amplifier $A_2$. The thermal current $I_C(t)$ is forced through the resistor $R_Y$ and the output of the amplifier $A_2$ is becomes the voltage of the thermal signal $V_C(t)$. The thermal signal $V_C(t)$ is applied to the current steering circuits CS1, CS2, and CSn.

Figure 6:
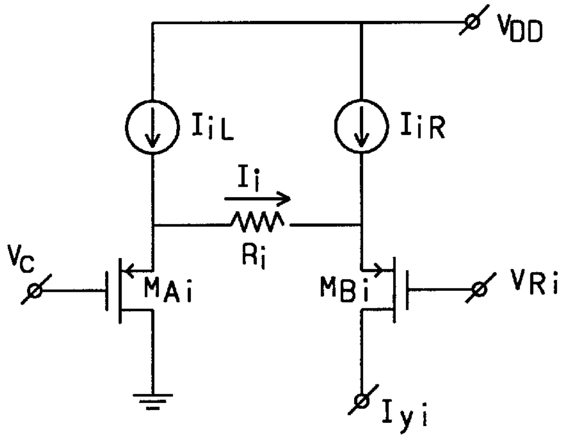
FIG. 6 is schematic diagram of a current steering circuit of this invention.

Refer now to FIG. 6 for a discussion of the structure and function of the current steering circuits CS1, CS2, and CSn. The thermal signal $V_C(t)$ is applied to the gate of the first MOS transistor MAi. The drain of the first MOS transistor MAi is connected to the power supply ground return. The gate of the second MOS transistor MBi is connected to one of the reference signals $V_{Ri}$ and the drain is connected to the output terminal that sources the contributing current $I_{Yi}$. The resistor $R_i$ is connected between the sources of the MOS transistors MAi and MBi. The first current source $I_{iL}$ is connected between the power supply voltage source $V_{DD}$ and the source of the first transistor MAi and the second current source $I_{iR}$ is connected between the power supply voltage source $V_{DD}$ and the source of the second transistor MBi. The magnitude of each of the currents provided by the current sources $I_{iL}$ and $I_{iR}$ are equal to the current $I_i$ through the resistor $R_i$.

The current steering circuit adjusts the contributing current $I_{Yi}$ such that, if the thermal signal $V_C(t)$ has a magnitude between a sum and a difference of the reference signal $V_{Ri}$ at the gate of the second MOS transistor MB and a signal $I_iR_i$ developed at the resistor $R_i$, an amount of the contributing current $I_Y$ transferred to the output node is determined by the equation:

$$I_{yi} = I_i + \frac{V_c - V_{Ri}}{R_i} \qquad \text{Eq. 10}$$

where:

$I_y$ is the amount of the contributing current, $I_{1A}$ is a magnitude of the first portion of the contributing current, $V_C$ is the thermal signal, $V_{R1}$ is the reference signal, and $R_1$ is the resistance of the resistor $R_1$.

As can be shown, the thermal signal $V_C$ of Equation 10 is:

$$V_{Ri} - I_iR_i < V_C < V_{Ri} + I_iR_i$$

and therefore, the contributing current $I_{Yi}$ becomes:

$$\begin{aligned} I_{yi} &= 0 \;\Big|\; V_{Ri} - I_iR_i \\ I_{yi} &= 2I_i \;\Big|\; V_{Ri} + I_iR_i \end{aligned}$$

If the thermal signal $V_C(t)$ has a magnitude that is less than the difference of the reference signal $V_{Ri}$ at the gate of the second MOS transistor and the signal $IR_i$ developed at the resistor $R_i$, the amount of the contributing current $I_Y$ transferred to the output node is zero. If the thermal signal $V_C(t)$ has a magnitude greater than the sum of the reference signal $V_{Ri}$ at the gate of the second MOS transistor and the signal $IR_i$ developed at the resistor, the amount of the contributing current $I_{Yi}$ transferred to the output node is twice the current $I_i$ through the resistor $R_i$.

Figure 7:
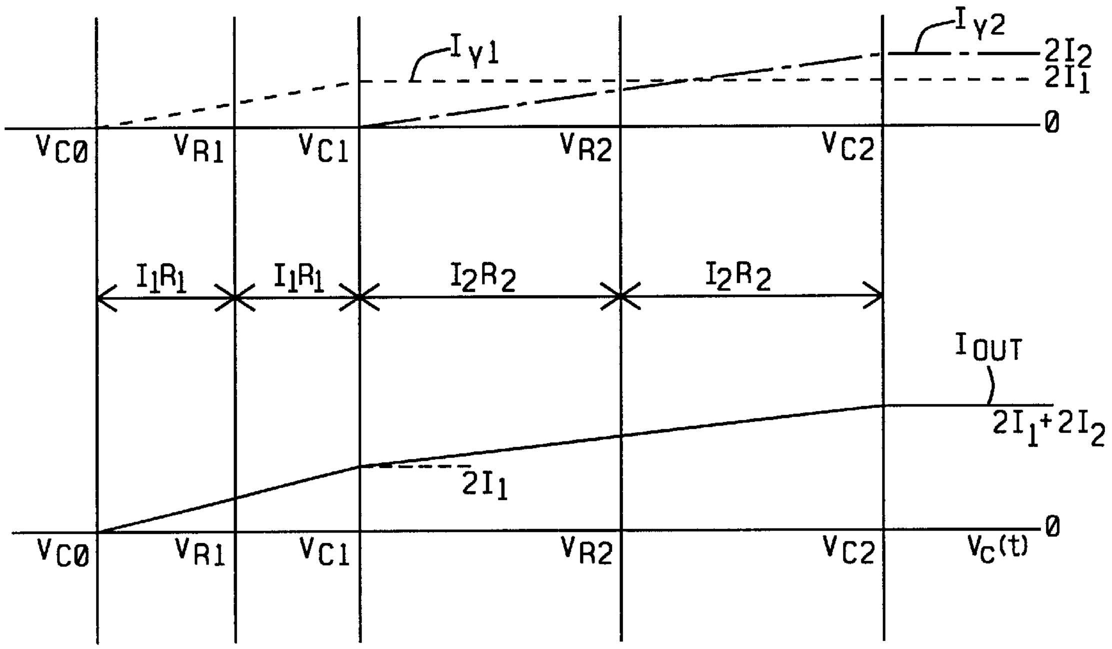
FIG. 7 is a plot of the first and second portions of the contributing currents and the total contributing current provided by the current steering circuit of FIG. 6 as a function of the thermal signal of this invention.

FIG. 7 shows that how a piecewise linear output current characteristic can be obtained by adding two such current steering circuits for instance CS1 and CS2 of FIG. 5 with different values of current sources $I_1$ and $I_2$ and resistors $R_1$ and $R_2$. As the temperature increase from a minimum temperature $T_0$, the thermal signal $V_C(t)$ increases from $V_{C0}$. The current $I_{Y1}$ from the current steering circuit CS1 increases from a zero level to the value of $2I_1$ as determined by Eq. 10. When the thermal signal $V_C(t)$ reaches the value $V_{C1}$, the output current $I_{Y1}$ of the current steering circuit becomes equal to $2I_1$ and remains at that level regardless of the change of the thermal signal $V_C(t)$. The output current $I_{Y2}$ from current steering circuit CS2 remains at a zero level for the thermal signal $V_C(t)$ at a value less than $V_{C1}$ and begins to rise according to the function of Eq. 10 when the thermal signal $V_C(t)$ reaches the value of $V_{C1}$. The current $I_{Y2}$ rises as the temperature rises until the thermal signal $V_C(t)$ reaches the value $V_{C2}$. The current $I_{Y2}$ then equal $2I_2$ and remains at this level independent of the change in temperature.

The contributing currents $I_{Y1}$ and $I_{Y2}$ are summed at the node S2 to form the current $I_{OUT}$ having the function as shown. It is worth mentioning that the output current $I_{Yi}$ in FIG. 5 does not follow the expressions given exactly. The current saturates less abruptly compared to what is predicted. This effect is also shown in FIG. 7 with the fine dotted traces. However, this results in a smoother overall characteristic because of the overlap of currents from the various current steering circuits.

Referring back to FIGS. 3 and 5, the output node of each of the current steering circuits CS1, CS2, and CSn is connected to the summing node S2. The current mirror formed by the MOS transistor MCO provides the fundamental contribution current $I_0$ to the summing node S2. The master biasing current $I_{OUT}$ is the sum of the fundamental contribution current $I_0$ and some or all of the portions created as described in FIG. 6 of the contributing currents $I_{Y1}, I_{Y2}, \ldots, I_{Yn}$ as formed at the summing node $S_2$, as shown in the equation:

$$I_{out}(V_c) = I_0 + \sum_{i=1}^{n} I_i(V_c)$$

where:

$$\begin{aligned} I_i(V_c) &= I_i + \frac{V_c - V_{Ri}}{R_i} && \mid V_{c(i-1)} \le V_c \le V_{ci} \\ &= 0 && \mid V_c < V_{c(i-1)} \\ &= 2I_i && \mid V_c > V_{ci} \end{aligned}$$

$$V_{Ci} - V_{C(i-1)} = 2I_iR_i$$

The master biasing current $I_{OUT}$ is the control current input to the current mirror IM. The MOS transistors $M_{O0}$, $M_{O1}$, $M_{O2}$, $M_{O3}$, . . . $M_{Oi}$ are configured to form the current mirror IM. The ratios of the device structures of the transistors $M_{O0}$, $M_{O1}$, $M_{O2}$, $M_{O3}$, . . . $M_{Oi}$ determine the biasing currents $I_{OUT1}$, $I_{OUT2}$, $I_{OUT3}$, and $I_{OUTi}$, which are proportional to the master biasing current and maintain the temperature relationship established by the nonlinear current multiplier NLCM.

The bandgap referenced voltage generator $V_{REF}$ generates the reference signals $V_{R0}$, $V_{R1}$, $V_{R2}$, . . . , $V_{Rn-1}$, $V_{Rn}$ that determine in a piecewise fashion of the function of the master biasing current $I_{OUT}$. The bandgap referenced voltage generator $V_{REF}$ in the preferred embodiment is referenced to a bandgap voltage source $V_{BG}$. The bandgap voltage source is the non-inverting input to the amplifier $A_3$. The amplifier $A_3$ is a configured as a voltage buffer circuit to isolate the bandgap voltage source $V_{BG}$ from the loading of the biasing current generator of this invention. The resistors $R_{D0}$, $R_{D1}$, $R_{D2}$, . . . , $R_{Dn-1}$, $R_{Dn}$ are serially connected to form a voltage divider. The reference signals $V_{R0}$, $V_{R1}$, $V_{R2}$, . . . , $V_{Rn-1}$, $V_{Rn}$ are created at the junction of each pair of the serially connected resistors $R_{D0}$, $R_{D1}$, $R_{D2}$, . . . $R_{Dn-1}$, $R_{Dn}$. The values of the resistors $R_{D0}$, $R_{D1}$, $R_{D2}$, . . . , $R_{Dn-1}$, $R_{Dn}$ are chosen such that the reference signals $V_{R0}$, $V_{R1}$, $V_{R2}$, . . . , $V_{Rn-1}$, $V_{Rn}$ are determined by the equation:

$$V_{Ri} = \frac{V_{c(i-1)} + V_{ci}}{2}$$

for $$i = 1 \text{ to } n$$

and $$V_{C0} = V_{R0}$$

where:

$V_{C0}$ is the thermal signal representing the minimum temperature of the range of temperatures for which the temperature compensating bias generating circuit is to provide compensation.

$V_{R0}$ is the magnitude of the lowest reference signal of the reference signals $V_{R0}$, $V_{R1}$, $V_{R2}$, . . . , $V_{Rn-1}$, $V_{Rn}$ formed by the voltage divider of the reference signal generator $V_{REF}$.

Figure 8:
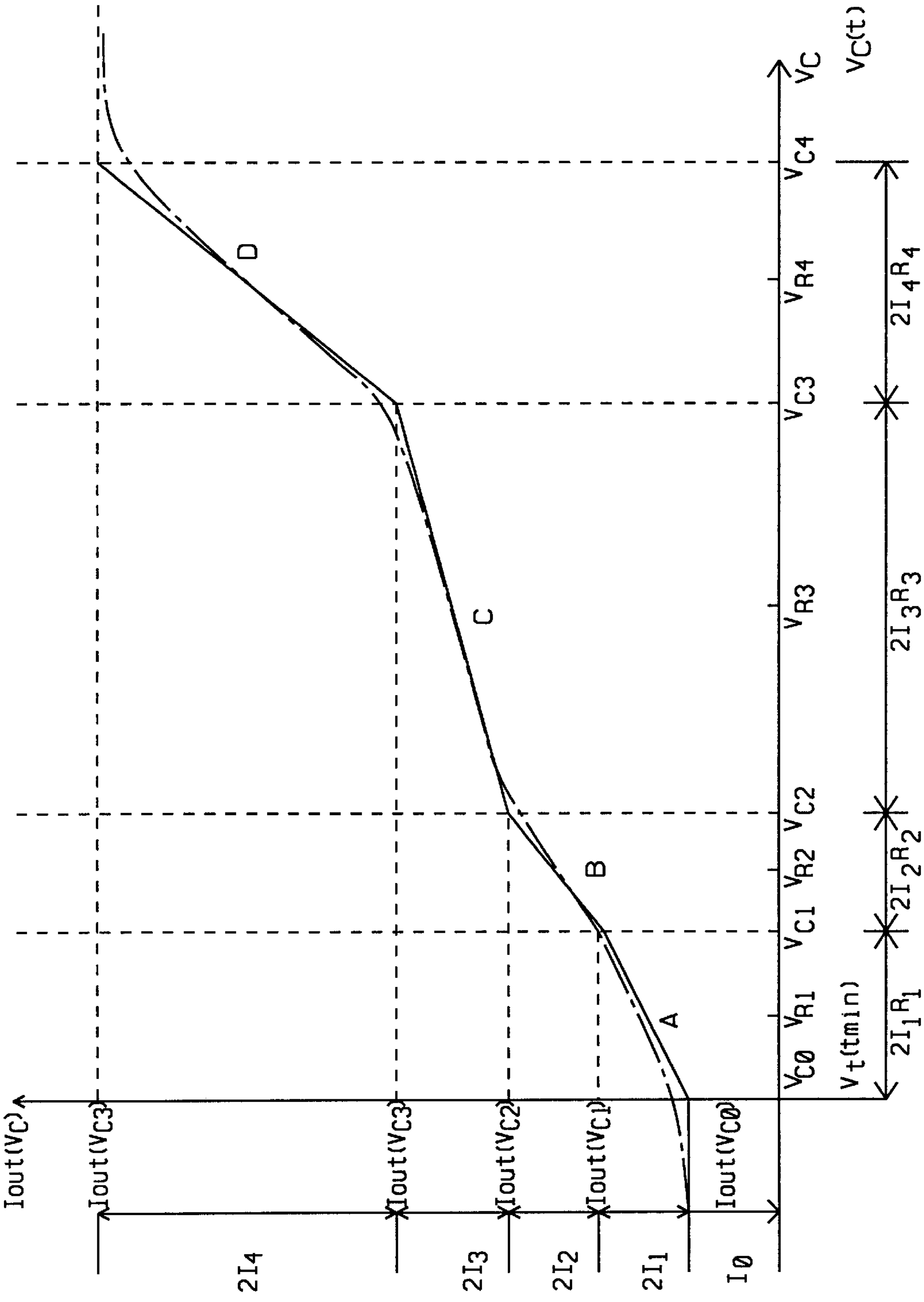
FIG. 8 is a plot of the master biasing current as a function of the thermal signal of this invention.

FIG. 8 illustrates the master biasing current $I_{OUT}$ of a temperature compensating bias current generator of this invention versus the thermal signal $V_C(t)$. The plot of FIG. 8 is used to explain the method to construct the master biasing current $I_{OUT}$. The symbolic representation of the effects of temperature on the operating parameters of the functional circuit are described. The thermal signal $V_C(t)$ is substituted for the temperature and the reference signals $V_{Ri}$ are determined as piece-wise functions over the range of the thermal signal $V_C(t)$ to be used. In FIG. 8, the temperature compensating biasing current generator is being designed to have four piece-wise regions A, B, C, and D to describe the master biasing current $I_{OUT}$. This means that there are four current steering circuits CSn (where n=4) as shown n FIG. 5. The portions $I_1$, $I_2$, $I_3$, and $I_4$ of the contributing current $I_{Yi}$ and the resistors $R_1$, $R_2$, $R_3$, and $R_4$, are selected to determine the slope function of the each of piece-wise regions A, B, C, and D. For temperatures less than a minimum value that yields a thermal signal $V_{C0}$, the output current is set to a fundamental contribution current $I_0$.

The thermal signal $V_C(t)$ is then compared to each of the reference signals $V_{R1}$, $V_{R2}$, $V_{R3}$, and $V_{R4}$. When the thermal signal $V_C(t)$ reaches the value of the reference signal $V_{R1}$ less the signal $I_1R_1$ developed across the resistor $R_1$, the master biasing current becomes the value of the contributing current $I_{Y1}$ as determined by Eq. 10. This is as shown in Region A. Upon reaching the value of the reference signal $V_{R1}$ summed with the signal $I_1R_1$ developed across the resistor $R_1$, the contributing current $I_{Y1}$ becomes fixed at the value $2I_1$ and the second contributing current $I_{Y2}$ is as determined by Eq. 10 and is added to the master biasing current $I_{OUT}$. This is as shown in Region B. As the temperature increases, the master biasing current $I_{OUT}$ is adjusted by the addition of the contributing currents $I_{Y3}$ and $I_{Y4}$ from the current steering circuits CS3 and CS4 as shown in Regions C and D.

The piece-wise function of the preferred embodiment of this invention is shown as substantially linear as is evident in FIGS. 7 and 8. However, it is keeping with the intent of this invention that any achievable piece-wise function may be used, thus the voltage reference generator $V_{REF}$ of FIG. 5 maybe more complex than the voltage divider formed of the serially connected resistors $R_{D0}$, $R_{D1}$, $R_{D2}$, . . . , $R_{Dn-1}$, $R_{Dn}$.

While this invention has been particularly shown and described with reference to the preferred embodiments thereof, it will be understood by those skilled in the art that various changes in form and details may be made without departing from the spirit and scope of the invention.

The invention claimed is:

1. A temperature compensating bias current generator to create a master biasing current having unique temperature characteristics, said bias current generator comprising:

a temperature converter to provide a thermal signal indicating a magnitude of temperature; and a current function generator in communication with the temperature converter to multiply the thermal signal by a bias function having the unique temperature characteristics to create the master biasing current, wherein said bias function is determined by a plurality of reference signals that are compared to the thermal signal to perform said multiplication.

2. The bias generator of claim 1 wherein the temperature converter comprises:

a temperature independent current source to provide a first current that does not fluctuate with a change in temperature;

a proportional-to-absolute-temperature current source to provide a second current that varies with temperature;

a current difference circuit associated with the temperature independent current source and the proportional-to-absolute-temperature current source to receive the first and second currents and from the first and second currents generate the thermal signal that is indicative of a difference between the first and second currents.

3. The bias current generator of claim 1 further comprising a plurality of mirrored current sources in communication with the current function generator to produce a plurality of bias currents mirrored from said master biasing current.

4. The bias current generator of claim 2 wherein the current difference circuit comprises:

a current subtractor circuit in communication with the temperature independent current source and the proportional-to-absolute-temperature current source to receive the first and second currents and to subtract the first and second to generate a thermal current;

a signal converter connected to the current subtractor to receive the thermal current and convert said thermal current to the thermal signal.

5. The bias current generator of claim 1 further comprising a bandgap referenced signal source that generates and communicates the plurality of reference signals to the current function generator.

6. The bias current generator of claim 5 wherein the current function generator comprises a current multiplier in communication with the temperature converter to receive the thermal signal, compare the thermal signal with the reference signals to determine a contributing currents indicated by the reference signals to be added to form the master biasing current.

7. The bias current generator of claim 6 wherein the current multiplier comprises:

a plurality of current steering circuits, each current steering circuit comparing the thermal signal to one of the plurality of reference signals to selectively steer all or some of one of the contributing currents to an output node; and a current summing node connected to the output node of each of the plurality of current steering circuits to additively combine the selectively steered contributing currents to form the master biasing current.

8. The bias current generator of claim 7 wherein each current steering circuit comprises:

a first MOS transistor having a gate to receive the thermal signal, and a drain connected to a power supply return terminal;

a second MOS transistor having a gate to receive one of the reference signals, and a drain connected to the current summing node to provide some or all of the contributing current;

a first current source in communication with a source of the first MOS transistor to provide some or all a first portion of the contributing current;

a second current source in communication with a source of the second MOS transistor to provide some or all a second portion of the contributing current; and a resistor connected between the sources of the first and second MOS transistors such that some or all of the first and second portions or the contributing current selectively flow through the first or second MOS transistor.

9. The bias generator of claim 8 wherein, if the thermal signal has a magnitude between a sum and a difference of the reference signal at the gate of the second MOS transistor and a signal developed at the resistor, an amount of the contributing current transferred to the output node is determined by the equation:

$$I_y = I_1 + \frac{V_c - V_{RI}}{R}$$

where:

$I_y$ is the amount of the contributing current, $I_1$ is a magnitude of the first portion of the contributing current, $V_C$ is the thermal signal, $V_{R1}$ is the reference signal, and R is the resistance of the resistor.

10. The bias generator of claim 8 wherein, if the thermal signal has a magnitude is less than the difference of the reference signal at the gate of the second MOS transistor and the signal developed at the resistor, the amount of the contributing current transferred to the output node is zero.

11. The bias generator of claim 8 wherein, if the thermal signal has a magnitude greater than the sum of the reference signal at the gate of the second MOS transistor and the signal developed at the resistor, the amount of the contributing current transferred to the output node is a sum of the first and second portions of the contributing current.

12. A temperature compensating bias current generator to create a master biasing current having unique temperature characteristics, said bias current generator comprising:

a temperature converter to provide a thermal signal indicating a magnitude of temperature;

a current function generator in communication with the temperature converter to multiply the thermal signal by a bias function having the unique temperature characteristics to create the master biasing current;

a plurality of mirrored current sources in communication with the current function generator to produce a plurality of bias currents mirrored from said master biasing current; and a bandgap referenced signal source that generates and communicates a plurality of reference signals to the current function generator, wherein the plurality of reference signals are compared to the thermal signal, said reference signals chosen to determine the bias function.

13. The bias generator of claim 12 wherein the temperature converter comprises:

a temperature independent current source to provide a first current that does not fluctuate with a change in temperature;

a proportional-to-absolute-temperature current source to provide a second current that varies with temperature; and a current difference circuit associated with the temperature independent current source and the proportional-to-absolute-temperature current source to receive the first and second currents and from the first and second currents generate the thermal signal that is indicative of a difference between the first and second currents.

14. The bias current generator of claim 13 wherein the current difference circuit comprises:

a current subtractor circuit in communication with the temperature independent current source and the proportional-to-absolute-temperature current source to receive the first and second currents and to subtract the first and second to generate a thermal current;

a signal converter connected to the current subtractor to receive the thermal current and convert said thermal current to the thermal signal.

15. The bias current generator of claim 13 wherein the current function generator comprises a current multiplier in communication with the temperature converter to receive the thermal signal, compare the thermal signal with the reference signals to determine a contributing currents indicated by the reference signals to be added to form the master biasing current.

16. The bias current generator of claim 15 wherein the current multiplier comprises:

a plurality of current steering circuits, each current steering circuit comparing the thermal signal to one of the plurality of reference signals to selectively steer all or some of one of the contributing currents to an output node; and a current summing node connected to the output node of the plurality of current steering circuits to additively combine the selectively steered contributing currents to form the master biasing current.

17. The bias current generator of claim 16 wherein each current steering circuit comprises:

a first MOS transistor having a gate to receive the thermal signal, and a drain connected to a voltage reference terminal;

a second MOS transistor having a gate to receive one of the reference signals, and a drain connected to the current summing node to provide some or all of the contributing current;

a first current source in communication with a source of the first MOS transistor to provide some or all a first portion of the contributing current;

a second current source in communication with a source of the second MOS transistor to provide some or all a second portion of the contributing current; and a resistor connected between the sources of the first and second MOS transistors such that some or all of the first and second portions or the contributing current selectively flow through the first or second MOS transistor.

18. The bias generator of claim 17 wherein, if the thermal signal has a magnitude between a sum and a difference of the reference signal at the gate of the second MOS transistor and a signal developed at the resistor, an amount of the contributing current transferred to the output node is determined by the equation:

$$I_y = I_1 + \frac{V_c - V_{RI}}{R}$$

where:

$I_y$ is the amount of the contributing current, $I_1$ is a magnitude of the first portion of the contributing current, $V_C$ is the thermal signal, $V_{R1}$ is the reference signal, and R is the resistance of the resistor.

19. The bias generator of claim 17 wherein, if the thermal signal has a magnitude is less than the difference of the reference signal at the gate of the second MOS transistor and the signal developed at the resistor, the amount of the contributing current transferred to the output node is zero.

20. The bias generator of claim 17 wherein, if the thermal signal has a magnitude greater than the sum of the reference signal at the gate of the second MOS transistor and the signal developed at the resistor, the amount of the contributing current transferred to the output node is a sum of the first and second portions of the contributing current.

21. A temperature compensating bias current generator to create a master biasing current having unique temperature characteristics, said bias current generator comprising:

a temperature converter to provide a thermal signal indicating a magnitude of temperature, said temperature converter comprising:

a temperature independent current source to provide a first current that does not fluctuate with a change in temperature, a proportional-to-absolute-temperature current source to provide a second current that varies with temperature, and a current difference circuit associated with the temperature independent current source and the proportional-to-absolute-temperature current source to receive the first and second currents and from the first and second currents generate the thermal signal that is indicative of a difference between the first and second currents;

a current function generator in communication with the temperature converter to multiply the thermal signal by a bias function having the unique temperature characteristics to create the master biasing current, said current function generator comprising:

a current multiplier in communication with the temperature converter to receive the thermal signal, compare the thermal signal with the reference signals to determine a contributing currents indicated by the reference signals to be added to form the master biasing current;

a plurality of mirrored current sources in communication with the current function generator to produce a plurality of bias currents mirrored from said master biasing current; and a bandgap referenced signal source that generates and communicates a plurality of reference signals to the current function generator, wherein the plurality of reference signals are compared to the thermal signal, said reference signals chosen to determine the bias function.

22. The bias current generator of claim 21 wherein the current difference circuit comprises:

a current subtractor circuit in communication with the temperature independent current source and the proportional-to-absolute-temperature current source to receive the first and second currents and to subtract the first and second to generate a thermal current;

a signal converter connected to the current subtractor to receive the thermal current and convert said thermal current to the thermal signal.

23. The bias current generator of claim 21 wherein the current multiplier comprises:

a plurality of current steering circuits, each current steering circuit comparing the thermal signal to one of the plurality of reference signals to selectively steer all or some of one of the contributing currents to an output node; and a current summing node connected to the output node of the plurality of current steering circuits to additively combine the selectively steered contributing currents to form the master biasing current.

24. The bias current generator of claim 23 wherein each current steering circuit comprises:

a first MOS transistor having a gate to receive the thermal signal, and a drain connected to a voltage reference terminal;

a second MOS transistor having a gate to receive one of the reference signals, and a drain connected to the current summing node to provide some or all of the contributing current;

a first current source in communication with a source of the first MOS transistor to provide some or all a first portion of the contributing current;

a second current source in communication with a source of the second MOS transistor to provide some or all a second portion of the contributing current; and a resistor connected between the sources of the first and second MOS transistors such that some or all of the first and second portions or the contributing current selectively flow through the first or second MOS transistor.

25. The bias generator of claim 23 wherein, if the thermal signal has a magnitude between a sum and a difference of the reference signal at the gate of the second MOS transistor and a signal developed at the resistor, an amount of the contributing current transferred to the output node is determined by the equation:

$$I_y = I_1 + \frac{V_c - V_{RI}}{R}$$

where:

$I_y$ is the amount of the contributing current, $I_1$ is a magnitude of the first portion of the contributing current, $V_C$ is the thermal signal, $V_{R1}$ is the reference signal, and R is the resistance of the resistor.

26. The bias generator of claim 23 wherein, if the thermal signal has a magnitude is less than the difference of the reference signal at the gate of the second MOS transistor and the signal developed at the resistor, the amount of the contributing current transferred to the output node is zero.

27. The bias generator of claim 23 wherein, if the thermal signal has a magnitude greater than the sum of the reference signal at the gate of the second MOS transistor and the signal developed at the resistor, the amount of the contributing current transferred to the output node is a sum of the first and second portions of the contributing current.

28. A method for generation of a temperature compensating bias current comprising the steps of:

determining a piecewise function substantially describing a required bias current with respect to temperature;

determining a plurality of reference signals, each reference signal describing an amount of a contributing current of a plurality of contributing currents, which, when summed together, generate the bias current;

creating a thermal signal, the magnitude of said thermal signal indicating a temperature;

comparing each of the reference signals to the thermal signal;

identifying which of the contributing currents and which portions of said contributing currents are be included to generate the bias current; and summing identified contributing currents and the portions of the contributing currents to form the bias current.

29. The method of claim 28 wherein the thermal signal is formed by the steps of:

providing a temperature independent control signal having a constant magnitude over temperature;

providing a proportional-to-absolute-temperature signal having a magnitude that varies with temperature; and subtracting the temperature independent control signal from the proportional-to-absolute-temperature signal to form the thermal signal.

30. The method of claim 28 wherein the reference signals are referenced to a semiconductor bandgap voltage.

* * * * *